United States Patent [19]

Jones

[11] Patent Number: 4,701,134
[45] Date of Patent: Oct. 20, 1987

[54] ELECTRICAL CONNECTOR PROVIDING SWITCHABLE CONNECTIONS BETWEEN ELEMENTS

[75] Inventor: Graeme P. Jones, Springfield, England

[73] Assignee: Polyhitech, Bedfordshire, England

[21] Appl. No.: 852,836

[22] PCT Filed: Aug. 23, 1985

[86] PCT No.: PCT/GB85/00381
§ 371 Date: Apr. 16, 1986
§ 102(e) Date: Apr. 16, 1986

[87] PCT Pub. No.: WO86/01674
PCT Pub. Date: Mar. 13, 1986

[30] Foreign Application Priority Data

Aug. 24, 1984 [GB] United Kingdom ............... 8421549

[51] Int. Cl.⁴ ............................................ H01R 29/00
[52] U.S. Cl. ...................................... 439/43; 200/252; 439/189
[58] Field of Search ............. 339/17 CF, 18 R, 18 C, 339/18 B, 18 P, 154 A, 154 R, 156 R; 200/16 R, 16 D, 252, 260, 292; 324/158 F

[56] References Cited

U.S. PATENT DOCUMENTS 3,621,157 11/1971 Schwab ........................... 339/17 CF
4,393,281 7/1983 Ohmori et al. ................... 200/16 D

OTHER PUBLICATIONS

Electronics, Dip Switch Isolates Faults in System, p. 112, 5-15-1975.

Primary Examiner—Neil Abrams
Attorney, Agent, or Firm—Welsh & Katz, Ltd.

[57] ABSTRACT

An electrical connector device for use in providing selectively switchable electrical connections between respective terminals of two circuit elements, comprising a unitary housing of electrically insulating material carrying a plurality of first socket terminals open to one face of the housing for receipt of terminals of a first circuit element, and carrying a plurality of second terminals projecting from a second face of the housing opposite to said one face, for connection to the second circuit element, and a plurality of individually operable switching elements each having an associated conductive portion which projects beyond said one face of the housing and each being selectively operable between a conductive state providing an electrical connection between said conductive portion and respective first and second terminals, a first non-conductive state in which said conductive portion is connected only to the associated first socket terminal, and a second non-conductive state in which said conductive portion is connected only to the associated second terminal.

1 Claim, 7 Drawing Figures

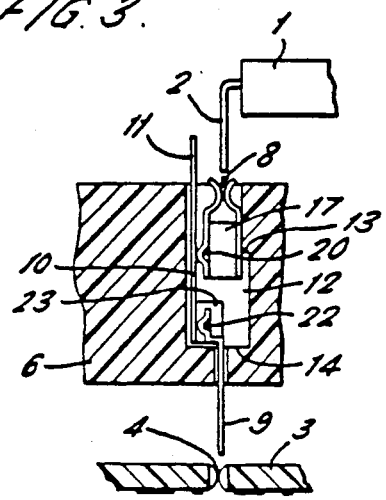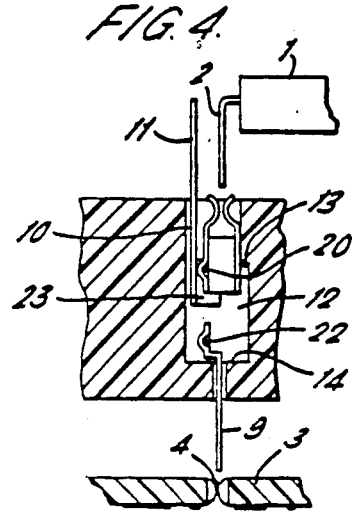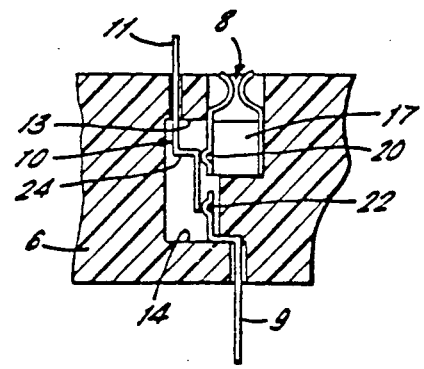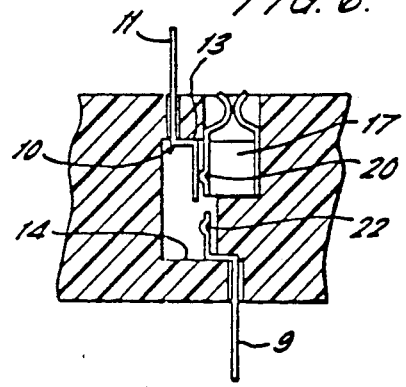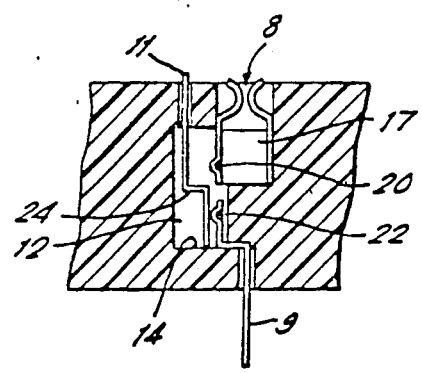

ELECTRICAL CONNECTOR PROVIDING SWITCHABLE CONNECTIONS BETWEEN ELEMENTS

This invention relates to an electrical connector device, and particularly such a device with provision for selective switching of individual connections made through the device.

The invention has particular, but not exclusive, practical application to the provision of switchable connections between respective terminals of two circuit elements, for example between respective terminal pins of a circuit component such as an integrated circuit element and a circuit which may consist of a circuit board having sockets provided with sprung contacts such that individual terminal pins of the integrated circuit element may be inserted removably into the sockets. Alternatively the circuit board may have apertures in which the individual terminal pins of the integrated circuit element are inserted and subsequently secured as by soldering.

Where a circuit component such as an integrated circuit element having, for example, "dual in-line" (DIL) terminal pins is connected directly to a circuit board the task of monitoring the performance of the circuit component, for fault-finding or diagnosis, is a difficult one for the electronic technician. In order to make electrical contact with individual terminal pins of the circuit component it is usually necessary to employ a special adaptor tool which grips the circuit component and makes separate electrical contact with each of the terminal pins. It is then possible for the technician to make connections to individual terminal pins of the circuit component through the adaptor, using suitable probe devices. The use of such an adaptor is time consuming, and therefore expensive in technician labour time. Moreover, the use of the adaptor may be difficult or impossible where space is restricted around a circuit component and a circuit board.

A further difficulty associated with the use of a multiway adaptor for making connections to individual terminal pins of a circuit component is that it is not generally possible, using such an adaptor to isolate individual terminal pins electrically from the circuit to which the component is connected in order to monitor the component's performance. Nor is it possible to isolate electrically the circuit board from the circuit component in order to monitor the performance of the circuit itself.

According to the present invention there is provided an electrical connector device for use in providing selectively switchable electrical connections between respective terminals of two circuit elements, the device including a plurality of individually operable switching elements each operable selectively between a conductive state providing an electrical connection between respective terminals of the two circuit elements, and at least one non-conductive state providing an electrical connection to only one of said respective terminals of the two circuit elements.

The switching elements may be electronic switches, for example transistor elements, although mechanically movable switching elements are preferred as they can afford an immediate visual check of the state of each switching element.

By disposing any selected one of the switching elements in its non-conductive state, or one of its such states, it is possible to monitor electrically one of the circuit elements in isolation from the other circuit element, while when the switching element is in its conductive state the respective terminals of the two circuit elements are interconnected electrically, and are electrically connected to the switching element, to which a probe may, for example, be attached to monitor circuit performance.

Preferably the device of the invention comprises an electrically insulating housing carrying a plurality of socket terminals open to one face for receipt of terminals of a first circuit element and carrying a plurality of terminals projecting from a face of the housing opposite to said one face, for connection to the second circuit element, each of the switching elements when in the conductive state providing an electrical connection between a socket terminal and an associated projecting terminal carried by the housing.

Each switching element preferably comprises a sliding member slidable in a direction perpendicular to said faces of the housing. The sliding movement of each sliding member can be limited by stop surfaces thereon engaging surfaces of the housing.

Preferably each sliding member projects beyond said one face of the housing, whereby it can give a visual indication of the state of the switching element while also serving for enabling monitoring or probe connections to be made.

Each switching element may have a single non-conductive state in which it is connected only to the associated socket terminal, enabling the respective terminal of the first circuit element to be monitored in isolation from the second circuit element. This is particularly useful where the first circuit element is, for example, an integrated circuit component. In an alternative embodiment of the invention, however, each switching element has a second non-conductive state in which it is connected only to the associated projecting terminal of the device, and therefore to a terminal of the second circuit element, enabling the performance of the second circuit element to be monitored in isolation from its electrical connection to some or all of the terminals of the first circuit element.

The invention will now be described, by way of example, with reference to the drawings, in which.

Figure 2:
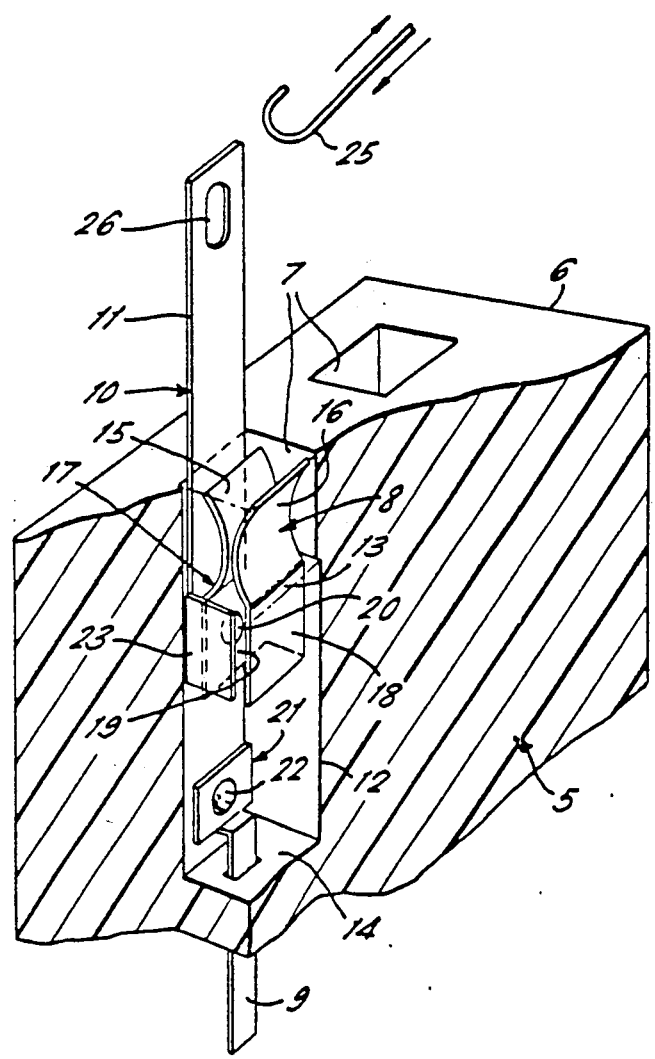
FIG. 2 is a partly cutaway diagrammatic perspective view, of part of the device shown in FIG. 1.

FIGS. 3 and 4 are schematic vertical sectional views showing one of the switching elements of the device of FIG. 2 in a conductive and a non-conductive position respectively; and FIGS. 5, 6 and 7 are respective diagrammatic sectional views showing a modified switching element with three different operative states, being a variant of the switching element shown in FIGS. 3 and 4.

Figure 1:
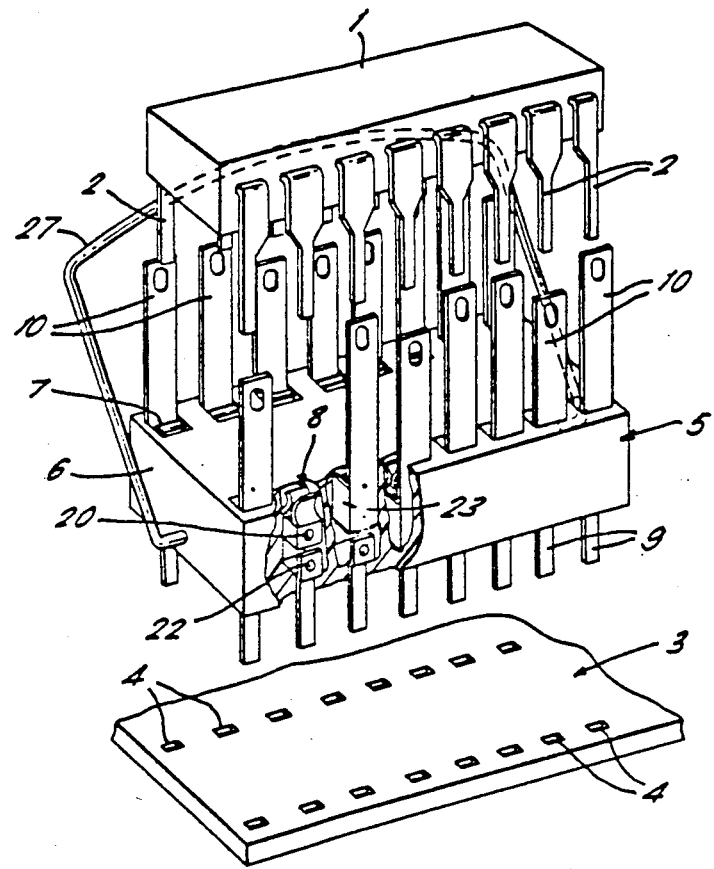
FIG. 1 is a diagrammatic perspective exploded view showing a device according to the invention with part broken away interposed between a circuit component and a printed circuit board.

FIG. 1 shows a first circuit element 1, for example, an integrated circuit, having external connection terminals in the form of two depending rows of flat terminal pins 2 arranged in a standard "dual in-line" configuration. The terminal pins are designed to make electrical contact with respective terminals of a second circuit element, in this case a printed circuit board 3 having two rows of sockets 4 with spring-loaded contacts designed to receive the terminal pins 2 of the circuit component 1.

The electrical connections established between the terminal pins 2 and the sockets 4 are releasable, in that the element 1 can be "unplugged" from the circuit board 3 for replacement or repair. For some applications the electrical connections between the terminal pins 2 and the printed circuit board 3 would be permanent, in which case the terminal pins 2 would project through apertures in the printed circuit board 3 and would have soldered connections to the printed circuit on the face of the board 3 opposite that which receives the element 1.

In order to provide for selective switching of the individual connections between the terminal pins 2 and the sockets 4 there is provided an electrical connector device 5 which is interposed between the terminal pins 2 and the sockets 4. The connector device 5 comprises a generally flat rectangular housing 6 of insulating material, for example rigid plastics, having two rows of rectangular slots 7 passing through the thickness of the housing 6 and with a spacing corresponding to the standard spacing of the terminals pins 2. In one face of the housing 6, shown uppermost in FIG. 1, the slots 7 are provided with respective connection socket terminals 8 formed by spring-loaded contacts (FIG. 2) which are substantially identical to the sockets 4 in the printed circuit board 3. In the opposite face of the housing 6, shown lowermost in FIG. 1, the slots 7 receive respective projecting terminals 9 which project downwardly and which conform in size, shape and spacing to the terminal pins 2 of the circuit component 1, the pins 9 being aligned with the sockets 8.

Thus, the terminals pins 2 of the element 1 can be plugged into the sockets 8 of the connector device 5, while the terminals 9 of the connector device 5 can be plugged into the sockets 4 of the printed circuit board 3.

Electrical connections between the respective sockets 8 and pins 9 of the connector device 5 can be made selectively by means of switching elements 10 in the form of sliding members which are captive within respective slots 7 in the housing 6.

One of the switching elements 10 is shown diagrammatically in FIG. 2, all the switching elements 10 being identical.

The switching element 10 consists of a conductive metal strip movable longitudinally within the respective slot 7 and having an integral terminal portion 11 extending through the upper end of the associated slot 7, that is, the end in which the associated socket 8 is received.

Each slot 7 has a portion of enlarged width defining a chamber 12 within the housing 6 bounded by upper and lower shoulders 13, 14. Each socket 8 is provided with a pair of sprung contact jaws 15, 16. The self-resilience of the jaws 15, 16 holds the jaws together, so that they are forced apart by the insertion of a terminal 2 between the jaws, establishing good electrical contact between the terminal and the jaws 15, 16. In this example the two jaws 15, 16 are integral parts of a single contact element 17 in the form of a sheet metal pressing of channel section (FIG. 2). The jaws 15, 16 are integral extensions of two parallel side flanges 18, 19 of the channel section pressing, the two flanges 18, 19 being parallel to each other in respective planes parallel to the longitudinal side wall of the housing 6. The contact element 17 is anchored within the chamber 12 by any suitable means, for example by an integral moulding process during the moulding of the housing 6. The outer flange 19 is parallel to an adjacent wall of the slot 7 in the housing 6, and is spaced therefrom by a gap of sufficient width to allow sliding movement in this gap of the switching element 10. The outwardly facing surface of the outer flange 19 is provided with a dimple 20 or other projection which makes sliding contact with the switching element 10.

The associated terminal 9 is also formed as a sheet metal pressing and has an integral head 21 located within the chamber 12. The head 21 is provided with a contact portion which in this example comprises a dimple 22 on one surface of the head 21, similar to the dimple 20, for making sliding contact with the switching element 10 in at least one position thereof.

Instead of the contact dimples 20, 22, the contact element 17 and the head 21 of the terminal 9 may be formed with integral resilient tongues which make sliding or wiping contact with the switching element 10.

The switching element 10 consists of a flat metal strip which may be pressed with a longitudinal stiffening rib (not shown). The element 10 is formed at the end within the chamber 12 with two lateral lugs 23 which are bent at right angles to the strip so as to lie parallel to each other. The lugs 23 serve to render the switching element 10 captive within the slot 7. The opposite ends of the lugs 23 abut the shoulders 13 and 14 to limit the sliding movement of the switching element 10 in the upward and downward directions respectively as viewed in the drawings.

Each switching element 10 has two working positions, illustrated diagrammatically in FIGS. 3 and 4, in each of which the terminal portion 11 of the element 10 projects upwardly from the upper face of the housing 6, clear of the terminals 2 inserted in the sockets 8. Thus the switching element 10 has a conductive lower position (FIG. 3) in which the lugs 23 abut the lower shoulder 14, and in which the element 10 makes contact with both the dimples 20, 22 of the contact element 17 and the terminal 9, electrically interconnecting the respective socket 8 and the terminal 9, and a non-conductive upper position, shown in FIGS. 2 and 4, in which the switching element 10 is raised so as to bring the lugs 23 into abutment with the shoulder 13. In this upper limit position the switching element 10 makes contact only with the dimple 20 of the contact element 17, and contact between the socket 8 and the associated terminal 9 is broken.

As will be evident from FIG. 1 the position of the visible part of each switching element 10 gives a convenient visual check of the state of each switching element. Thus, some of the elements 10 in FIG. 1 are shown in their lower conductive states and others are shown in their upper non-conductive states.

In a variant of the embodiment of FIGS. 1 to 4 the switching element 10 has two non-conductive positions. One such variant is shown in FIGS. 5, 6 and 7, in which the same reference numerals have been used to designate parts corresponding to those shown in FIGS. 1 to 4, and in which FIGS. 5 and 6 show the conductive and a first non-conductive state of the switching element 10, corresponding to FIGS. 3 and 4 respectively. In this variant the switching element 10 has a cranked portion 24 such that, when the switching element 10 is fully depressed into abutment with the stop shoulder 14, the element 10 makes contact only with the terminal 9 through the contact dimple 22. In this second non-conductive state, shown in FIG. 7, the terminal 9 is connected to the switching element 10, and therefore to the terminal portion 11 thereof, while being isolated electrically from the contact element 17 and the socket 8.

In all the operative positions of the switching element 10 the terminal portion 11 thereof can be used for monitoring or test purposes. When the switching element 10 is in its conductive state the terminal portion 11 can be used to tap the circuit while it is connected to the element 1, while in the first non-conductive state (FIG. 6) the terminal portion 11 allows the associated terminal 2 of the element 1 to be monitored while it is isolated from the circuit board 3, and in the second non-conductive state (FIG. 7) the switching element 10 allows the associated part of the circuit board 3 to be monitored while it is cut off from the respective terminal 2 of the element 1.

In both the embodiments illustrated all the switching elements 10 can be moved selectively to their respective operative positions independently of each other, so that some or all of the circuit connections to the element 1 and, in the variant of FIGS. 5–7, to the circuit board 3, can be monitored independently as desired.

The different operative positions of the switching elements 10 may be defined by snap-engagement of cooperating parts on each switching element 10 and on the wall of the slot 7 within which it slides. The selective movement of each switching element 10 can be effected by engagement of a hook-like tool, for example a test probe 25 of a piece of test equipment, in an eye formed at the free end of the terminal portion 11.

The slots 7 in the housing 6 of the connector device 5 may be formed by a moulding process. For example, the slots 7 can be formed by making grooves in the longitudinal side walls of a body including the enlarged portions which form the chambers 12, the grooves then being covered by a cover plate of insulating material applied to the longitudinal side wall of the body so as to define an outer boundary surface of the grooves 7 and the chambers 12.

Alternatively the housing 6 could be split longitudinally into two halves which are moulded separately and bonded together upon assembly to render the contact elements captive.

A hinged handle 27 may be attached to the body 4 of the connector device 5 or may be releasably engaged in apertures in the ends of the housing 6, to facilitate removal of the device 5 from the circuit board 3.

In cases where the connector device 5 is intended to be attached permanently to a printed circuit board 3, or to any other circuit element, the terminals 9 of the device 5 would have permanent connections to the circuit board or element, for example through soldered joints, in place of the releasable connections with the sockets 4.

Although in the embodiments described above the terminals, sockets and switching elements are made from pressed sheet material they can otherwise be formed from turned solid stock material.

Further, the device of the invention can be provided with ejection means operative in known manner to eject the device from a circuit element on which it is mounted and/or to eject a circuit element mounted on the device.

I claim:

1. An electrical connector device for use in providing switchable electrical connections between respective terminals of two circuit elements, the device comprising a unitary housing of electrically insulating material carrying a plurality of first socket terminals open to one face of the housing for receipt of terminals of a first circuit element, and carrying a plurality of second terminals projecting from a second face of the housing opposite to said one face for connection to the second circuit element, and a plurality of individually operable switching elements, each having an associated conductive portion which projects beyond said one face of the housing and each being selectively operable between a conductive state providing an electrical connection between said conductive portion and respective first and second terminals, a first non-conductive state in which said conductive portion is connected only to the associated first socket terminal, and a second non-conductive state in which said conductive portion is connected only to the associated second terminal.

* * * * *